United States Patent
Brown et al.

(10) Patent No.: US 12,198,944 B2
(45) Date of Patent: Jan. 14, 2025

(54) SUBSTRATE HANDLING IN A MODULAR POLISHING SYSTEM WITH SINGLE SUBSTRATE CLEANING CHAMBERS

(71) Applicant: Applied Materials, Inc., Santa Clara, CA (US)

(72) Inventors: Brian J. Brown, Palo Alto, CA (US); Ekaterina Mikhaylichenko, San Jose, CA (US); Jin Ji, Santa Clara, CA (US); Jagan Rangarajan, San Jose, CA (US); Steven M. Zuniga, Soquel, CA (US)

(73) Assignee: Applied Materials, Inc., Santa Clara, CA (US)

( * ) Notice: Subject to any disclaimer, the term of this patent is extended or adjusted under 35 U.S.C. 154(b) by 663 days.

(21) Appl. No.: 17/202,245

(22) Filed: Mar. 15, 2021

(65) Prior Publication Data

US 2022/0143780 A1    May 12, 2022

Related U.S. Application Data

(60) Provisional application No. 63/112,289, filed on Nov. 11, 2020.

(51) Int. Cl.
*H01L 21/67* (2006.01)
*B24B 41/06* (2012.01)

(52) U.S. Cl.
CPC ........ *H01L 21/67051* (2013.01); *B24B 41/06* (2013.01)

(58) Field of Classification Search
CPC ......... H01L 21/67017; H01L 21/67023; H01L 21/67028; H01L 21/67034; H01L 21/6704;
(Continued)

(56) References Cited

U.S. PATENT DOCUMENTS

| 2,998,680 A | 9/1961 | Lipkins |
| 3,518,798 A | 7/1970 | Boettcher |

(Continued)

FOREIGN PATENT DOCUMENTS

| CN | 101934491 B | 7/2012 |
| CN | 103962936 A | 8/2014 |

(Continued)

OTHER PUBLICATIONS

International Search Report dated Feb. 3, 2022 for Application No. PCT/US2021/053857.

(Continued)

*Primary Examiner* — David G Cormier
(74) *Attorney, Agent, or Firm* — Patterson + Sheridan, LLP

(57) ABSTRACT

Embodiments of the present disclosure generally relate to chemical mechanical polishing (CMP) systems, and more particular, to modular polishing systems used in the manufacturing of semiconductor devices. In one embodiment, a polishing system includes a first portion having a plurality of polishing stations disposed therein, and a second portion coupled to the first portion, the second portion comprising a substrate cleaning system. The substrate cleaning system comprises a wet-in/dry-out substrate cleaning module comprising a chamber housing which defines a chamber volume. The polishing system further includes a substrate handler located in the second portion, where the substrate handler is positioned to transfer substrates to or from the wet-in/dry-out substrate cleaning module through one or more openings formed in one or more sidewalls of the chamber housing.

15 Claims, 9 Drawing Sheets

(58) Field of Classification Search
CPC ......... H01L 21/67051; H01L 21/68742; H01L 21/67161; H01L 21/67167; H01L 21/67184; H01L 21/67196; H01L 21/67201; H01L 21/67739; H01L 21/67745; H01L 21/67748
See application file for complete search history.

(56) References Cited

U.S. PATENT DOCUMENTS

| | | | |
|---|---|---|---|
| 3,659,386 A | 5/1972 | Goetz et al. |
| 3,665,648 A | 5/1972 | Yamanaka |
| 3,731,435 A | 5/1973 | Boettcher et al. |
| 3,762,103 A | 10/1973 | Nielsen |
| 3,913,271 A | 10/1975 | Boettcher |
| 4,020,600 A | 5/1977 | Day |
| 4,021,278 A | 5/1977 | Hood et al. |
| 4,141,180 A | 2/1979 | Gill, Jr. et al. |
| 4,401,131 A | 8/1983 | Lawson |
| 4,502,252 A | 3/1985 | Iwabuchi |
| 4,509,298 A | 4/1985 | Klievoneit |
| 4,583,325 A | 4/1986 | Tabuchi |
| 4,653,231 A | 3/1987 | Cronkhite et al. |
| 4,944,119 A | 7/1990 | Gill, Jr. et al. |
| 5,081,051 A | 1/1992 | Mattingly et al. |
| 5,081,795 A | 1/1992 | Tanaka et al. |
| 5,216,843 A | 6/1993 | Breivogel et al. |
| 5,224,304 A | 7/1993 | Cesna |
| 5,232,875 A | 8/1993 | Tuttle et al. |
| 5,246,525 A | 9/1993 | Sato |
| 5,317,778 A | 6/1994 | Kudo et al. |
| 5,329,732 A | 7/1994 | Karlsrud et al. |
| 5,361,545 A | 11/1994 | Nakamura |
| 5,372,652 A | 12/1994 | Srikrishnan et al. |
| 5,421,768 A | 6/1995 | Fujiwara et al. |
| 5,443,416 A | 8/1995 | Volodarsky et al. |
| 5,456,627 A | 10/1995 | Jackson et al. |
| 5,478,435 A | 12/1995 | Murphy et al. |
| 5,486,131 A | 1/1996 | Cesna et al. |
| 5,498,199 A | 3/1996 | Karlsrud et al. |
| 5,551,829 A | 9/1996 | Jerolimov et al. |
| 5,584,647 A | 12/1996 | Uehara et al. |
| 5,649,854 A | 7/1997 | Gill, Jr. |
| 5,671,764 A | 9/1997 | Murakami et al. |
| 5,679,059 A * | 10/1997 | Nishi ............... H01L 21/67219 |
| | | 451/286 |
| 5,692,947 A | 12/1997 | Talieh et al. |
| 5,738,574 A | 4/1998 | Tolles et al. |
| 5,745,946 A | 5/1998 | Thrasher et al. |
| 5,804,507 A | 9/1998 | Perlov et al. |
| 5,851,041 A | 12/1998 | Anderson et al. |
| 5,918,817 A | 7/1999 | Kanno et al. |
| 5,934,979 A | 8/1999 | Talieh |
| 5,938,504 A | 8/1999 | Talieh |
| 5,944,582 A | 8/1999 | Talieh |
| 5,983,909 A * | 11/1999 | Yeol ............... H01L 21/67057 |
| | | 134/102.1 |
| 6,045,716 A | 4/2000 | Walsh et al. |
| 6,080,046 A | 6/2000 | Shendon et al. |
| 6,086,457 A | 7/2000 | Perlov et al. |
| 6,095,908 A | 8/2000 | Torii |
| 6,126,517 A | 10/2000 | Tolles et al. |
| 6,155,768 A | 12/2000 | Bacchi et al. |
| 6,156,124 A | 12/2000 | Tobin |
| 6,159,080 A | 12/2000 | Talieh |
| 6,179,690 B1 | 1/2001 | Talieh |
| 6,186,873 B1 | 2/2001 | Becker et al. |
| 6,200,199 B1 | 3/2001 | Gurusamy et al. |
| 6,220,941 B1 | 4/2001 | Fishkin et al. |
| 6,220,942 B1 | 4/2001 | Tolles et al. |
| 6,227,948 B1 | 5/2001 | Khoury et al. |
| 6,227,950 B1 | 5/2001 | Hempel et al. |
| 6,231,428 B1 | 5/2001 | Maloney et al. |
| 6,241,592 B1 | 6/2001 | Togawa et al. |
| 6,247,479 B1 | 6/2001 | Taniyama et al. |
| 6,283,822 B1 | 9/2001 | Togawa et al. |
| 6,293,849 B1 | 9/2001 | Kawashima |
| 6,309,279 B1 | 10/2001 | Bowman et al. |
| 6,322,427 B1 | 11/2001 | Li et al. |
| 6,332,470 B1 | 12/2001 | Fishkin et al. |
| 6,332,826 B1 | 12/2001 | Katsuoka et al. |
| 6,343,979 B1 | 2/2002 | Peltier et al. |
| 6,350,188 B1 | 2/2002 | Bartlett et al. |
| 6,354,918 B1 | 3/2002 | Togawa et al. |
| 6,354,922 B1 | 3/2002 | Sakurai et al. |
| 6,354,926 B1 | 3/2002 | Walsh |
| 6,358,126 B1 | 3/2002 | Jackson et al. |
| 6,361,648 B1 | 3/2002 | Tobin |
| 6,398,625 B1 | 6/2002 | Talieh |
| 6,402,598 B1 | 6/2002 | Ahn et al. |
| 6,405,739 B1 | 6/2002 | Liu |
| 6,409,582 B1 | 6/2002 | Togawa et al. |
| 6,413,146 B1 | 7/2002 | Katsuoka et al. |
| 6,413,356 B1 | 7/2002 | Chokshi et al. |
| 6,413,873 B1 | 7/2002 | Li et al. |
| 6,435,941 B1 | 8/2002 | White |
| 6,447,385 B1 | 9/2002 | Togawa et al. |
| 6,475,914 B2 | 11/2002 | Han |
| 6,568,408 B2 | 5/2003 | Mertens et al. |
| 6,572,730 B1 | 6/2003 | Shah |
| 6,575,816 B2 | 6/2003 | Hempel et al. |
| 6,579,148 B2 | 6/2003 | Hirokawa et al. |
| 6,582,282 B2 | 6/2003 | Somekh |
| 6,586,336 B2 | 7/2003 | Jeong |
| 6,592,438 B2 | 7/2003 | Tolles et al. |
| 6,592,439 B1 | 7/2003 | Li et al. |
| 6,612,317 B2 | 9/2003 | Costantini et al. |
| 6,616,512 B2 | 9/2003 | Sotozaki |
| 6,629,883 B2 | 10/2003 | Katsuoka et al. |
| 6,679,272 B2 | 1/2004 | Bran et al. |
| 6,682,408 B2 | 1/2004 | Sakurai et al. |
| 6,684,890 B2 | 2/2004 | Nicolosi et al. |
| 6,716,086 B1 | 4/2004 | Tobin |
| 6,745,784 B2 | 6/2004 | Katakabe et al. |
| 6,754,980 B2 | 6/2004 | Lauerhaas et al. |
| 6,770,151 B1 | 8/2004 | Ravkin et al. |
| 6,770,424 B2 | 8/2004 | Mandal et al. |
| 6,780,773 B2 | 8/2004 | Li et al. |
| 6,786,224 B2 | 9/2004 | Wong |
| 6,793,565 B1 | 9/2004 | Chadda et al. |
| 6,805,616 B2 | 10/2004 | Kawashima |
| 6,805,769 B2 | 10/2004 | Okuda et al. |
| 6,807,974 B2 | 10/2004 | Ono et al. |
| 6,817,923 B2 | 11/2004 | Smith |
| 6,818,066 B2 | 11/2004 | Cheung |
| 6,841,057 B2 | 1/2005 | Wadensweiler et al. |
| 6,843,257 B2 | 1/2005 | Yeo et al. |
| 6,848,976 B2 | 2/2005 | Somekh |
| 6,851,152 B2 | 2/2005 | Sotozaki et al. |
| 6,852,017 B2 | 2/2005 | Brown |
| 6,857,941 B2 | 2/2005 | Emami et al. |
| 6,860,277 B2 | 3/2005 | Lee et al. |
| 6,869,345 B2 | 3/2005 | Brown |
| 6,872,129 B2 | 3/2005 | Tobin |
| 6,878,044 B2 | 4/2005 | Sakurai et al. |
| 6,899,110 B2 | 5/2005 | Yoshida et al. |
| 6,916,231 B2 | 7/2005 | Wakabayashi |
| 6,918,814 B2 | 7/2005 | Katsuoka et al. |
| 6,935,934 B2 | 8/2005 | Walsh |
| 6,942,541 B2 | 9/2005 | Togawa et al. |
| 6,942,545 B2 | 9/2005 | Jeong |
| 6,942,737 B2 | 9/2005 | Sato |
| 6,949,466 B2 | 9/2005 | Jeong |
| 6,951,507 B2 | 10/2005 | Talieh |
| 6,969,305 B2 | 11/2005 | Kimura et al. |
| 6,977,036 B2 | 12/2005 | Wadensweiler et al. |
| 7,004,815 B2 | 2/2006 | Jeong |
| 7,011,569 B2 | 3/2006 | Shimizu et al. |
| 7,021,319 B2 | 4/2006 | Verhaverbeke et al. |
| 7,044,832 B2 | 5/2006 | Yilmaz et al. |
| 7,063,603 B2 | 6/2006 | Moore et al. |
| 7,066,791 B2 | 6/2006 | Brown |
| 7,070,475 B2 | 7/2006 | Manens et al. |
| 7,074,109 B1 | 7/2006 | Bennett et al. |
| 7,077,721 B2 | 7/2006 | Hu et al. |

(56) References Cited

U.S. PATENT DOCUMENTS

| | | |
|---|---|---|
| 7,077,916 B2 | 7/2006 | Deguchi |
| 7,084,064 B2 | 8/2006 | Liu et al. |
| 7,089,687 B2 | 8/2006 | Parks |
| 7,097,544 B1 | 8/2006 | Tolles et al. |
| 7,101,253 B2 | 9/2006 | Olgado |
| 7,101,255 B2 | 9/2006 | Katsuoka et al. |
| 7,104,867 B2 | 9/2006 | Jeong |
| 7,104,875 B2 | 9/2006 | Birang et al. |
| 7,153,370 B2 | 12/2006 | Lee et al. |
| 7,166,016 B1 | 1/2007 | Chen |
| 7,198,551 B2 | 4/2007 | Talieh |
| 7,238,090 B2 | 7/2007 | Tolles et al. |
| 7,241,203 B1 | 7/2007 | Chen et al. |
| 7,255,632 B2 | 8/2007 | Tolles et al. |
| 7,273,408 B2 | 9/2007 | Chen et al. |
| 7,303,467 B2 | 12/2007 | Birang et al. |
| 7,350,315 B2 | 4/2008 | Davis et al. |
| 7,387,455 B2 | 6/2008 | Awamura et al. |
| 7,390,744 B2 | 6/2008 | Jia et al. |
| 7,479,205 B2 | 1/2009 | Okuda et al. |
| 7,547,181 B2 * | 6/2009 | Fukatsu ............ H01L 21/67259 700/59 |
| 7,614,939 B2 | 11/2009 | Tolles et al. |
| 7,644,512 B1 | 1/2010 | Liu et al. |
| 7,651,384 B2 | 1/2010 | Golden et al. |
| 7,790,227 B2 | 9/2010 | Shite |
| 7,850,817 B2 | 12/2010 | Wakabayashi et al. |
| 7,891,314 B2 | 2/2011 | Pichler |
| 7,947,112 B1 | 5/2011 | Gerner et al. |
| 8,037,891 B2 | 10/2011 | Kanno et al. |
| 8,056,253 B2 | 11/2011 | Liu et al. |
| 8,079,894 B2 | 12/2011 | Tolles et al. |
| 8,113,221 B2 | 2/2012 | Nanba et al. |
| 8,118,945 B2 | 2/2012 | Eitoku |
| 8,137,162 B2 | 3/2012 | Abrahamians et al. |
| 8,172,643 B2 | 5/2012 | Yilmaz et al. |
| 8,186,297 B2 | 5/2012 | Park et al. |
| 8,202,140 B2 | 6/2012 | Hong et al. |
| 8,211,242 B2 | 7/2012 | Inoue et al. |
| 8,226,771 B2 | 7/2012 | Oikawa et al. |
| 8,276,291 B2 | 10/2012 | Liu et al. |
| 8,308,529 B2 | 11/2012 | D'Ambra et al. |
| 8,574,674 B2 | 11/2013 | Tanaka |
| 8,739,429 B2 | 6/2014 | Liu et al. |
| 8,795,032 B2 | 8/2014 | Miyazaki et al. |
| 8,962,085 B2 | 2/2015 | Mayer et al. |
| 8,967,935 B2 | 3/2015 | Goodman et al. |
| 8,968,055 B2 | 3/2015 | Chen et al. |
| 9,017,138 B2 | 4/2015 | Chen et al. |
| 9,159,593 B2 | 10/2015 | Kawaguchi et al. |
| 9,165,799 B2 | 10/2015 | Wang et al. |
| 9,227,293 B2 | 1/2016 | David et al. |
| 9,337,065 B2 | 5/2016 | Liu et al. |
| 9,352,441 B2 | 5/2016 | Zuniga et al. |
| 9,355,836 B2 | 5/2016 | Frank et al. |
| 9,358,662 B2 | 6/2016 | Miyazaki et al. |
| 9,412,627 B2 | 8/2016 | Nonaka |
| 9,421,617 B2 | 8/2016 | Goodman et al. |
| 9,434,045 B2 | 9/2016 | Yeh et al. |
| 9,570,311 B2 | 2/2017 | Kuo et al. |
| 9,592,585 B2 | 3/2017 | Lin et al. |
| 9,610,673 B2 | 4/2017 | Torikoshi |
| 9,687,955 B2 | 6/2017 | Watanabe et al. |
| 9,899,240 B2 | 2/2018 | Hashizume et al. |
| 10,002,777 B2 | 6/2018 | Kweon et al. |
| 10,008,380 B2 | 6/2018 | Ishibashi et al. |
| 10,032,654 B2 | 7/2018 | Negoro et al. |
| 10,040,102 B2 | 8/2018 | Mitsuyoshi et al. |
| 10,040,166 B2 | 8/2018 | Nabeya et al. |
| 10,043,653 B2 | 8/2018 | Chen et al. |
| 10,090,189 B2 | 10/2018 | Ishibashi |
| 10,096,492 B2 | 10/2018 | Maeda et al. |
| 10,259,098 B2 | 4/2019 | Motoshima et al. |
| 10,293,455 B2 | 5/2019 | Nabeya et al. |
| 10,347,511 B2 | 7/2019 | Verhaverbeke et al. |
| 10,395,949 B2 | 8/2019 | Ishibashi |
| 10,446,416 B2 | 10/2019 | Mui et al. |
| 10,478,938 B2 | 11/2019 | Torikoshi |
| 10,486,285 B2 | 11/2019 | Miyazaki et al. |
| 10,513,006 B2 | 12/2019 | Wu et al. |
| 10,737,301 B2 | 8/2020 | Ishibashi |
| 2002/0009954 A1 | 1/2002 | Togawa et al. |
| 2002/0115392 A1 | 8/2002 | Kawashima |
| 2002/0197946 A1 | 12/2002 | Emami et al. |
| 2003/0003848 A1 | 1/2003 | Tobin |
| 2003/0017706 A1 | 1/2003 | Moore et al. |
| 2003/0022497 A1 | 1/2003 | Li et al. |
| 2003/0202092 A1 | 10/2003 | Sadighi et al. |
| 2004/0023495 A1 | 2/2004 | Butterfield et al. |
| 2004/0053560 A1 | 3/2004 | Sun et al. |
| 2004/0053566 A1 | 3/2004 | Tolles et al. |
| 2004/0072445 A1 | 4/2004 | Sun et al. |
| 2004/0072499 A1 | 4/2004 | Wakabayashi |
| 2004/0097169 A1 | 5/2004 | Moore |
| 2004/0137823 A1 | 7/2004 | Sakurai et al. |
| 2004/0137828 A1 | 7/2004 | Takahashi et al. |
| 2004/0206373 A1 | 10/2004 | Donoso et al. |
| 2004/0226655 A1 | 11/2004 | Kajino et al. |
| 2005/0070210 A1 | 3/2005 | Jeong |
| 2005/0176349 A1 | 8/2005 | Yilmaz et al. |
| 2005/0178666 A1 | 8/2005 | Tsai et al. |
| 2005/0227586 A1 | 10/2005 | Jeong |
| 2005/0233578 A1 | 10/2005 | Jia et al. |
| 2005/0241684 A1 | 11/2005 | Achkire et al. |
| 2005/0272352 A1 | 12/2005 | Polyak et al. |
| 2005/0282472 A1 | 12/2005 | Jeong |
| 2006/0003673 A1 | 1/2006 | Moore |
| 2006/0030156 A1 | 2/2006 | Butterfield et al. |
| 2006/0035563 A1 | 2/2006 | Kalenian et al. |
| 2006/0046623 A1 | 3/2006 | Wang et al. |
| 2006/0057812 A1 | 3/2006 | Liu et al. |
| 2006/0070872 A1 | 4/2006 | Mavliev et al. |
| 2006/0105680 A1 | 5/2006 | Jeong |
| 2006/0123658 A1 | 6/2006 | Izumi |
| 2006/0172671 A1 | 8/2006 | Chen et al. |
| 2006/0183407 A1 | 8/2006 | David |
| 2007/0006904 A1 | 1/2007 | Hagiwara et al. |
| 2007/0066200 A9 | 3/2007 | Li et al. |
| 2007/0077861 A1 | 4/2007 | Chen |
| 2007/0096315 A1 | 5/2007 | Manens et al. |
| 2007/0125405 A1 | 6/2007 | Sekiguchi et al. |
| 2007/0128982 A1 | 6/2007 | Lee et al. |
| 2008/0026681 A1 | 1/2008 | Butterfield et al. |
| 2008/0035474 A1 | 2/2008 | Wang et al. |
| 2008/0038993 A1 | 2/2008 | Jeong |
| 2008/0047841 A1 | 2/2008 | Manens et al. |
| 2008/0051014 A1 | 2/2008 | Jeong et al. |
| 2008/0156657 A1 | 7/2008 | Butterfield et al. |
| 2008/0166958 A1 | 7/2008 | Golden et al. |
| 2008/0242202 A1 | 10/2008 | Wang et al. |
| 2008/0274673 A1 | 11/2008 | Adachi |
| 2008/0289656 A1 | 11/2008 | Kondoh |
| 2009/0068934 A1 | 3/2009 | Hong et al. |
| 2009/0101181 A1 | 4/2009 | Morisawa et al. |
| 2009/0255555 A1 | 10/2009 | Gouk et al. |
| 2009/0270015 A1 | 10/2009 | D'Ambra et al. |
| 2009/0305612 A1 | 12/2009 | Miyazaki et al. |
| 2010/0024981 A1 * | 2/2010 | Wallace ............ H01L 21/67109 156/345.27 |
| 2010/0154837 A1 | 6/2010 | Ogawa et al. |
| 2012/0006362 A1 * | 1/2012 | Yamamoto ........ H01L 21/67051 134/33 |
| 2012/0064800 A1 | 3/2012 | Watanabe et al. |
| 2012/0103371 A1 | 5/2012 | Yun et al. |
| 2012/0322345 A1 | 12/2012 | Rangarajan et al. |
| 2013/0115862 A1 | 5/2013 | Rangarajan et al. |
| 2013/0167947 A1 | 7/2013 | Nakano et al. |
| 2013/0199405 A1 | 8/2013 | Rangarajan et al. |
| 2013/0288578 A1 | 10/2013 | Chen et al. |
| 2013/0291905 A1 | 11/2013 | Hashizume et al. |
| 2014/0083468 A1 | 3/2014 | Miyazaki et al. |
| 2014/0196749 A1 | 7/2014 | Tang et al. |
| 2014/0213157 A1 | 7/2014 | Torikoshi |
| 2014/0220863 A1 | 8/2014 | Wu et al. |

(56) References Cited

U.S. PATENT DOCUMENTS

| | | |
|---|---|---|
| 2015/0044944 A1 | 2/2015 | Chen |
| 2015/0318179 A1 | 11/2015 | Yeh et al. |
| 2015/0367464 A1 | 12/2015 | Chen |
| 2016/0096211 A1 | 4/2016 | Izaki |
| 2018/0311784 A1 | 11/2018 | Trojan |
| 2019/0088510 A1 | 3/2019 | Ishibashi |
| 2019/0131145 A1 | 5/2019 | Tai et al. |
| 2020/0286753 A1 | 9/2020 | Velazquez et al. |

FOREIGN PATENT DOCUMENTS

| | | | |
|---|---|---|---|
| CN | 102725830 B | 3/2016 | |
| CN | 107546155 A | 1/2018 | |
| CN | 103962936 B | 8/2018 | |
| CN | 105904335 B | 4/2019 | |
| CN | 111834259 A | 10/2020 | |
| CN | 109346427 B | 1/2021 | |
| CN | 112735984 A | 4/2021 | |
| DE | 3411120 A1 | 11/1984 | |
| DE | 3737904 A1 | 5/1989 | |
| EP | 806265 A1 * | 11/1997 | ........... B24B 37/345 |
| EP | 1738871 B1 | 2/2009 | |
| JP | 10074717 | 3/1998 | |
| JP | 11000625 A | 1/1999 | |
| JP | H114643 A | 1/1999 | |
| JP | 2000262988 A | 9/2000 | |
| JP | 2001135604 A | 5/2001 | |
| JP | 2001189260 A | 7/2001 | |
| JP | 2002016028 A | 1/2002 | |
| JP | 2002050607 A | 2/2002 | |
| JP | 2002086048 A | 3/2002 | |
| JP | 3372760 B2 | 2/2003 | |
| JP | 3382064 B2 | 3/2003 | |
| JP | 2004335671 A | 11/2004 | |
| JP | 3927936 B2 | 6/2007 | |
| JP | 3960516 B2 | 8/2007 | |
| JP | 4023907 B2 | 12/2007 | |
| JP | 4333866 B2 | 9/2009 | |
| JP | 5349944 B2 | 11/2013 | |
| JP | 5528486 B2 | 6/2014 | |
| JP | 6276982 B2 | 2/2018 | |
| JP | 201846108 A | 3/2018 | |
| JP | 2019021859 A | 2/2019 | |
| JP | 2019050287 A | 3/2019 | |
| JP | 2019093474 A | 6/2019 | |
| JP | 2020174091 A | 5/2021 | |
| KR | 101388111 B1 | 4/2014 | |
| KR | 101484120 B1 | 1/2015 | |
| KR | 101538188 B1 | 7/2015 | |
| KR | 20170084073 A | 7/2017 | |
| KR | 101786485 B1 | 10/2017 | |
| KR | 101801987 B1 | 12/2017 | |
| KR | 102184591 B1 | 12/2020 | |
| TW | 201318771 | 5/2013 | |
| TW | 201513201 A | 4/2015 | |
| TW | I509721 B | 11/2015 | |
| TW | 202034397 A | 9/2020 | |
| WO | 2016076303 A1 | 5/2016 | |
| WO | 2019089467 A1 | 5/2019 | |

OTHER PUBLICATIONS

Taiwanese Office Action dated Sep. 27, 2023 for Application No. 110140533.
Japanese Office Action issued to Patent Application No. 2022-544712 on Oct. 24, 2023.
Office Action dtd Jan. 29, 2024 For KR 10-2022-7026239.

* cited by examiner

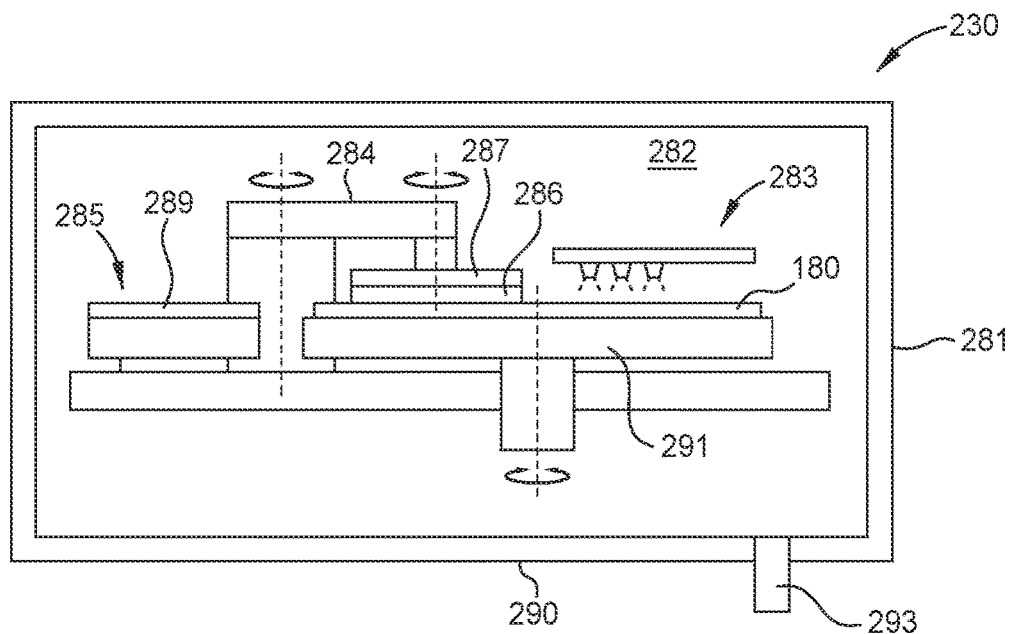
FIG. 2D
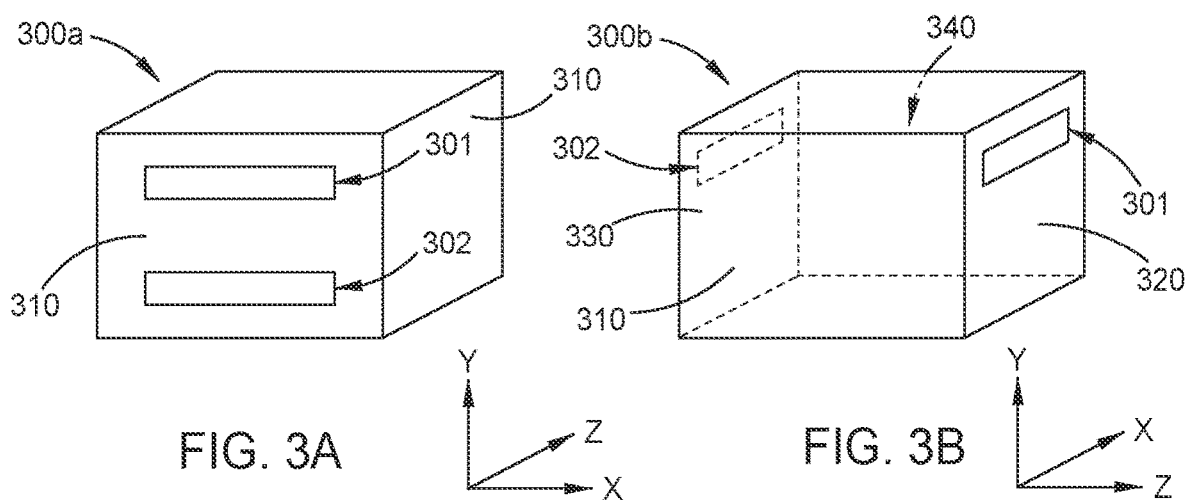
FIG. 3A
FIG. 3B

SUBSTRATE HANDLING IN A MODULAR POLISHING SYSTEM WITH SINGLE SUBSTRATE CLEANING CHAMBERS

CROSS-REFERENCE TO RELATED APPLICATIONS

This application claims priority to U.S. Provisional Application Ser. No. 63/112,289, filed on Nov. 11, 2020, which is herein incorporated by reference in its entirety.

BACKGROUND

Field

Embodiments described herein generally relate to equipment used in the manufacturing of electronic devices, and more particularly, to systems used to clean and dry substrate surfaces following the chemical mechanical polishing (CMP) of the substrate in a semiconductor device manufacturing process.

Description of the Related Art

Chemical mechanical polishing (CMP) is commonly used in the manufacturing of high-density integrated circuits to planarize or polish a layer of material deposited on a substrate. In a typical CMP process, a substrate is retained in a carrier head that presses the backside of the substrate towards a rotating polishing pad in the presence of a polishing fluid. Material is removed across the material layer surface of the substrate in contact with the polishing pad through a combination of chemical and mechanical activity which is provided by the polishing fluid and a relative motion of the substrate and the polishing pad. Typically, after one or more CMP processes are complete a polished substrate will be further processed to one or a more post-CMP substrate processing operations, such as one or a combination of cleaning, inspection, and measurement operations. Once the post-CMP operations are complete, a substrate can then be sent out of a CMP processing area to the next device manufacturing process, such as a lithography, etch, or deposition process.

To conserve valuable manufacturing floor space and reduce labor costs, a CMP system will commonly include a first portion, e.g., a back portion, comprising a plurality of polishing stations and a second portion, e.g., a front portion, which has been integrated with the first portion to from a single polishing system. The first portion may comprise one or a combination of post-CMP substrate cleaning systems, substrate surface inspection stations, and/or pre or post-CMP metrology stations. Post-CMP cleaning systems are used to clean and dry the surfaces of a substrate following the polishing process. Typically, substrates are moved between modules of the post-CMP system using one or more substrate handlers, e.g., robots.

Unfortunately, undesirable contaminates, such as residual water, polishing fluids, polishing byproducts, and cleaning fluids often remain on the substrate handling surfaces of the substrate handlers and/or are frequently reintroduced thereto. Cross-contamination and/or reintroduction of contaminants to substrate handling surfaces results in the undesirable reintroduction of contaminants to the surfaces of a cleaned and dried substrate before the substrate is removed from the polishing system. Such contamination of the active surface of the substrate can adversely affect device performance and/or cause device failure which results in suppressed yield of usable devices formed on the substrate.

Accordingly, what is needed in the art are cleaning systems and methods that solve the problems described above.

SUMMARY

Embodiments of the present disclosure generally relate to chemical mechanical polishing (CMP) systems, and integrated cleaning systems used to clean and dry substrate surfaces following polishing of the substrate, and methods related thereto. In one embodiment, a polishing system includes a first portion having a plurality of polishing stations disposed therein, and a second portion coupled to the first portion, the second portion comprising a substrate cleaning system. The substrate cleaning system comprises a wet-in/dry-out substrate cleaning module comprising a chamber housing which defines a chamber volume. The polishing system further includes a substrate handler located in the second portion, where the substrate handler is positioned to transfer substrates to or from the wet-in/dry-out substrate cleaning module through one or more openings formed in one or more sidewalls of the chamber housing.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2D is a schematic side view of a horizontal pre-clean (HPC) module, according to one embodiment, which may be used with the modular polishing system of FIGS. 2A-2C.

FIGS. 3A-3B are schematic perspective views of embodiments of single substrate cleaning (SSC) modules which may be used with the modular system polishing system of FIGS. 2A-2B.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to chemical mechanical polishing (CMP) systems used in the semiconductor device manufacturing industry. More particularly, embodiments herein relate to improved cleaning modules for CMP systems.

Generally, individual cleaning modules of a cleaning system are used to clean and dry the surfaces of a polished substrate. A typical cleaning system include a plurality of wet cleaning stations, such as one or more buffing stations, one or more spray stations, and one or more brush boxes, and a drying station. Polished substrates are transferred from polishing stations located in a first portion of a polishing system to the cleaning system that is located in a second portion of the polishing system using a substrate handler. Typically, the polished substrate have residual polishing fluids, water, and other polishing contaminants on the surfaces thereof and are therefore transferred from the first portion to the second portion in a "wet" condition. The substrate handler used to transfer the substrates is configured for handling substrates in a wet condition and is commonly known as a "wet" substrate handler or robot. Once in the front portion, the substrate is transferred between the individual ones of the plurality of cleaning modules using one or more wet substrate handlers before being transferred to the drying station. Substrates are transferred to the drying station using a wet substrate handler and are removed from the drying station using a different substrate handler configured for handling dry substrates, i.e., a "dry" substrate handler.

Figure 1:
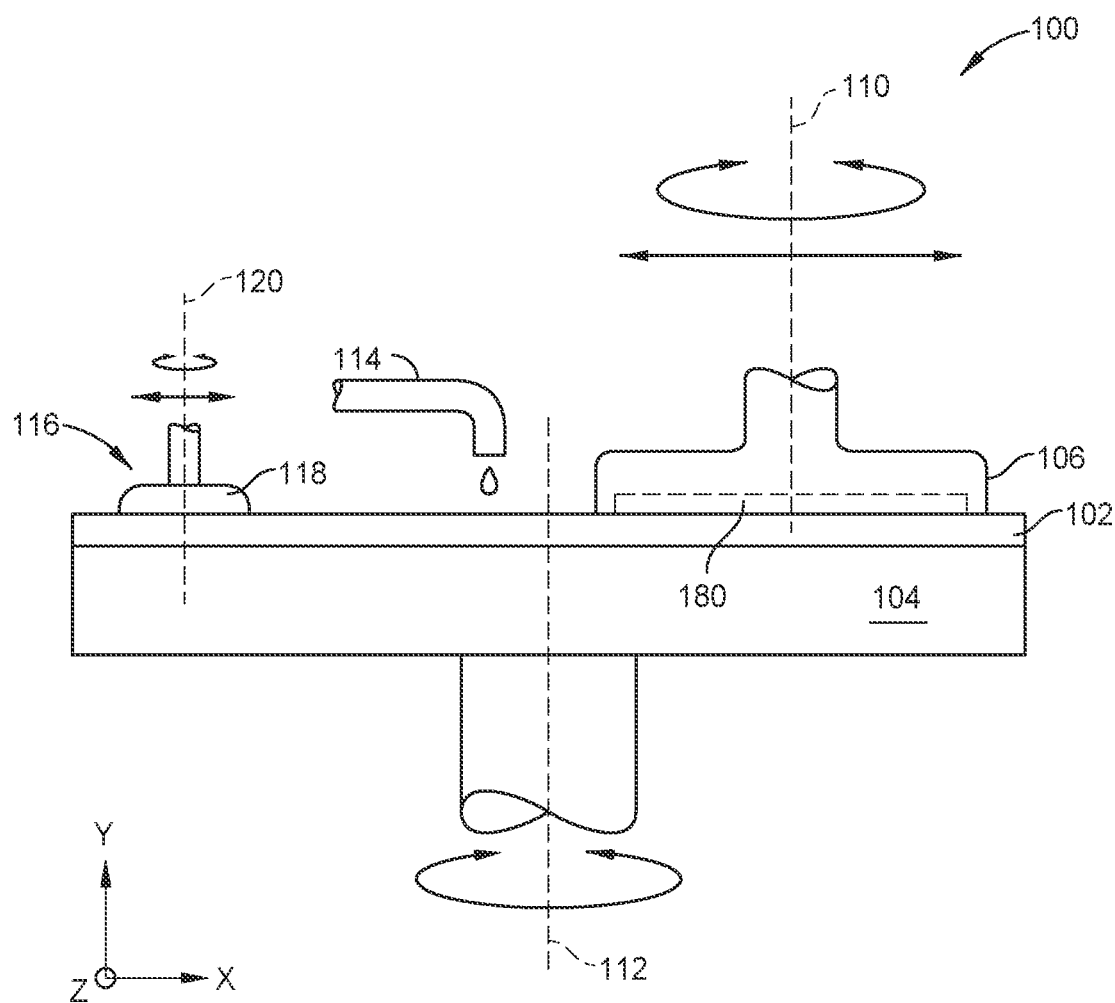
FIG. 1 is a schematic side view of a polishing station, according to one embodiment, which may be used as the polishing station for one or more of a plurality of polishing modules of the modular polishing systems described herein.

FIG. 1 is a schematic side view of an example polishing station 100 which may be used as the polishing station for one or more of the polishing modules of the modular polishing systems described herein. Here, the polishing station 100 features a platen 104, having a polishing pad 102 secured thereto, and a substrate carrier 106. The substrate carrier 106 faces the platen 104 and the polishing pad 102 mounted thereon. The substrate carrier 106 is used to urge a material surface of a substrate 180, disposed therein, against the polishing surface of the polishing pad 102 while simultaneously rotating about a carrier axis 110. Typically, the platen 104 rotates about a platen axis 112 while the rotating substrate carrier 106 sweeps back and forth from an inner radius to an outer radius of the platen 104 to, in part, reduce uneven wear of the polishing pad 102.

The polishing station 100 further includes a fluid delivery arm 114 and a pad conditioner assembly 116. The fluid delivery arm 114 is positioned over the polishing pad 102 and is used to deliver a polishing fluid, such as a polishing slurry having abrasives suspended therein, to a surface of the polishing pad 102. Typically, the polishing fluid contains a pH adjuster and other chemically active components, such as an oxidizing agent, to enable chemical mechanical polishing of the material surface of the substrate 180. The pad conditioner assembly 116 is used to condition the polishing pad 102 by urging a fixed abrasive conditioning disk 118 against the surface of the polishing pad 102 before, after, or during polishing of the substrate 180. Urging the conditioning disk 118 against the polishing pad 102 includes rotating the conditioning disk 118 about an axis 120 and sweeping the conditioning disk 118 from an inner diameter the platen 104 to an outer diameter of the platen 104. The conditioning disk 118 is used to abrade, rejuvenate, and remove polish byproducts or other debris from, the polishing surface of the polishing pad 102.

Figure 2A:
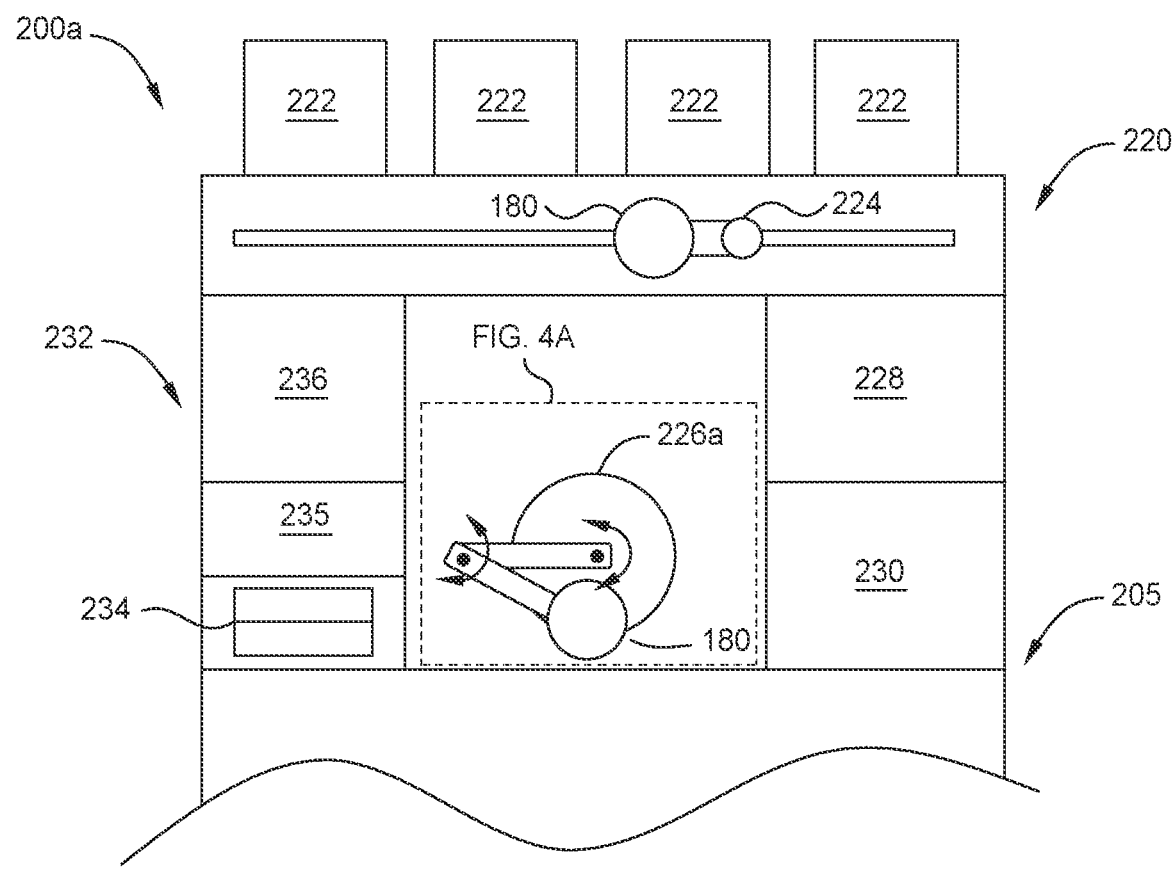
FIG. 2A is a schematic top down sectional view of a modular polishing system, according to one embodiment.
Figure 2A:
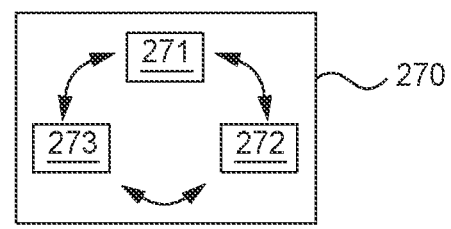
Figure 2B:
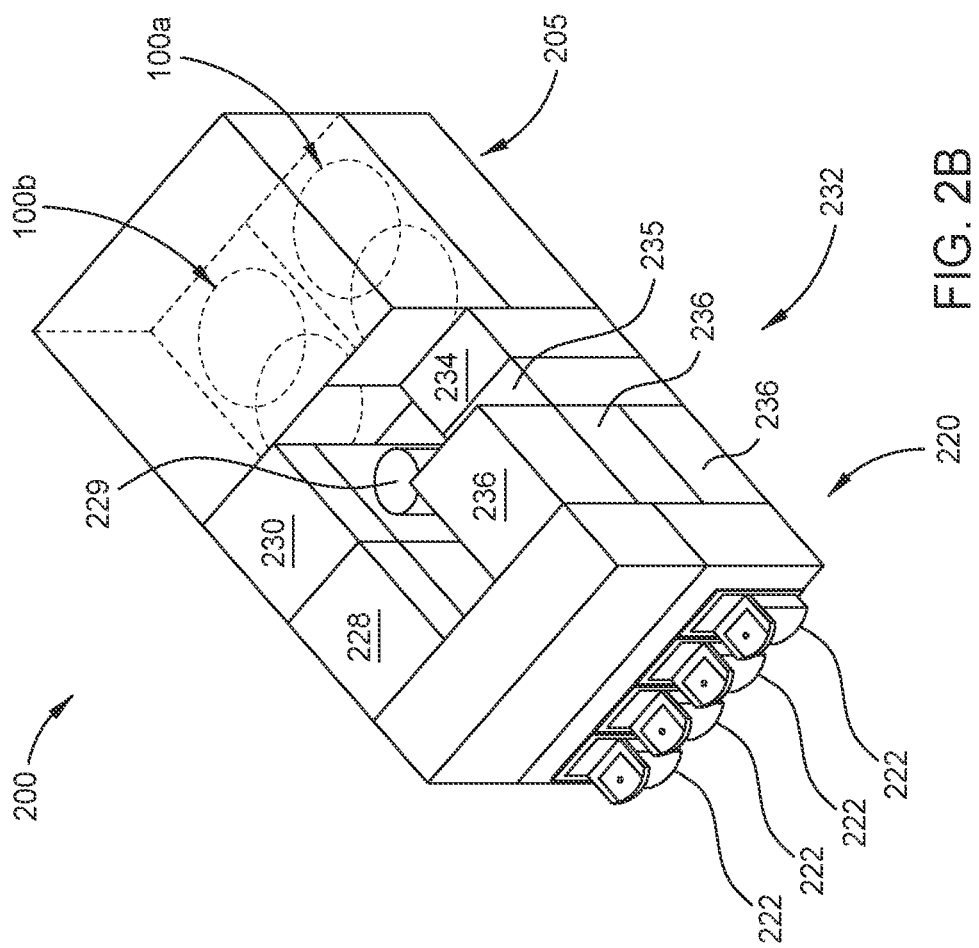
FIG. 2B is a schematic perspective view of the modular polishing system of FIG. 2A.

FIG. 2A is a schematic top down sectional view of a modular polishing system 200 having an integrated cleaning system 232 formed according to embodiments descried herein. FIG. 2B is a schematic perspective view of the modular polishing system of FIG. 2A. Here, the modular polishing system 200 features a first portion 205 and a second portion 220 coupled to the first portion 205. The first portion 205 includes a plurality of the polishing stations 100a,b, such as the polishing station 100 described in FIG. 1, which are not shown here in order to reduce visual clutter.

The second portion 220 includes a plurality of system loading stations 222, one or more substrate handlers 224, 226, one or more metrology stations 228, one or more location specific polishing (LSP) modules 229 (FIG. 2B), and a substrate cleaning system 232. The one or more substrate handlers 224, 226 are used alone or in combination to transfer substrates 180 between the first portion 205 and the second portion 220, to move substrates within the second portion 220, including between the various modules, stations, and systems thereof, and to transfer substrates to and from the system loading stations 222. The LSP module 229 is typically configured to polish only a portion of a substrate surface using a polishing member (not shown) that has a surface area that is less than the surface area of a to-be-polished substrate. LSP modules 229 are often used after a substrate has been polished within a polishing module to touch up, e.g., remove additional material, from a relatively small portion of the substrate.

The substrate cleaning system 232 facilitates removal of residual polishing fluids and polishing byproducts from surfaces of a substrate 180 following polishing thereof. Here, the substrate cleaning system 232 includes one or more of a first cleaning module, such as one or more horizontal pre-clean (HPC) modules 230 (further described in FIG. 2D), one or more second cleaning modules 234, such as brush boxes and/or spray stations, and one or more third cleaning modules, such as one or a plurality of single substrate clean (SSC) modules 236 (three shown). In some embodiments, the substrate cleaning system 232 further includes one or more fourth cleaning modules 235 configured to clean polishing fluid residues from the surfaces of a using a solution of sulfuric acid ($H_2SO_4$) and hydrogen peroxide ($H_2O_2$).

In some embodiments, such as shown in FIG. 2B, a plurality of SSC modules 236 are disposed in a vertical stacked arrangement. The stacked arrangement of SSC modules 236 facilitates concurrent processing of a plurality of individual substrates disposed in each of the SSC modules 236. Each of the SSC modules 236 is configured to both clean the substrate using one or more "wet" cleaning and/or rinsing fluids and to dry the substrate thereafter, thus eliminating the need for time-consuming substrate transfer handling operations between individual wet-clean and drying stations of a conventional multi-station cleaning system. The use of a plurality of SSC modules 236 in the vertical stacked arrangement beneficially increases the substrate processing throughput density of the modular polishing system 200 when compared to a conventional polishing systems.

Here, operation of the modular polishing system 200 is directed by a system controller 270. The system controller 270 includes a programmable central processing unit (CPU) 271 which is operable with a memory 272 (e.g., non-volatile memory) and support circuits 273. The support circuits 273 are conventionally coupled to the CPU 271 and comprise cache, clock circuits, input/output subsystems, power supplies, and the like, and combinations thereof coupled to the various components of the modular polishing system 200, to facilitate control thereof. The CPU 271 is one of any form of general purpose computer processor used in an industrial setting, such as a programmable logic controller (PLC), for controlling various components and sub-processors of the processing system. The memory 272, coupled to the CPU 271, is non-transitory and is typically one or more of readily available memories such as random access memory (RAM), read only memory (ROM), floppy disk drive, hard disk, or any other form of digital storage, local or remote.

Typically, the memory 272 is in the form of a non-transitory computer-readable storage media containing instructions (e.g., non-volatile memory), which when executed by the CPU 271, facilitates the operation of the modular polishing system 200. The instructions in the memory 272 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 270 may be used with one or any combination of the various modular polishing systems described herein and/or with the individual polishing modules thereof.

Figure 2C:
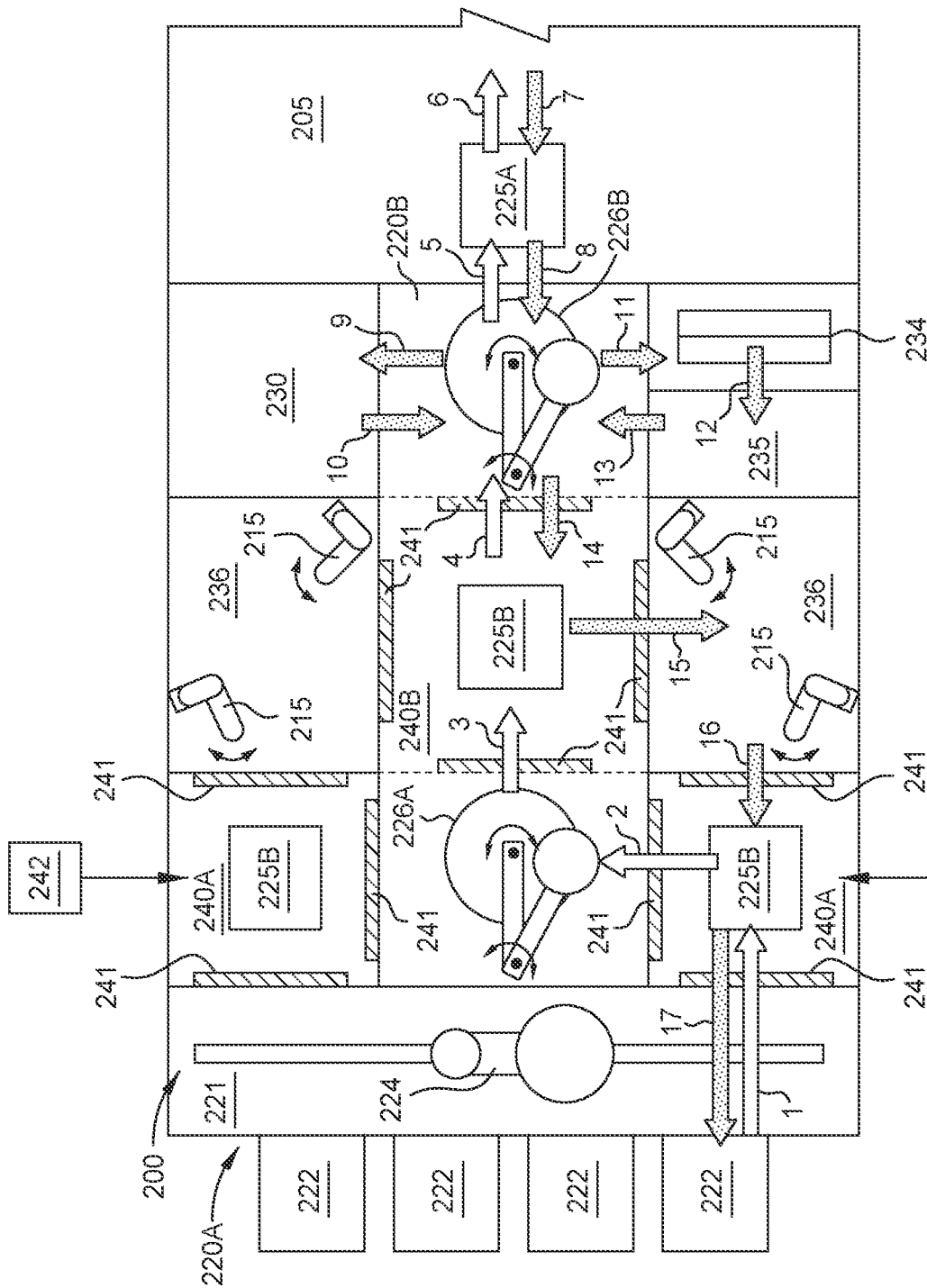
FIG. 2C is a schematic top view of the modular polishing system, according to another embodiment.

In some embodiments, such as shown in FIG. 2C, the individual ones of the SSC modules 236 are disposed on opposite sides of the second portion 220 so that one or more substrate handlers 226 are disposed therebetween. In some embodiments, the modular polishing system 200 further includes one or more substrate holding stations 225a-b disposed between the substrate handler 224 and the one or more substrate handlers 226, between individual substrate handlers 226, and/or between different modules and systems of the second portion 220, such as holding station 225b. In some embodiments, the modular polishing system 200 includes a substrate holding station 225a disposed between the first portion 205 and the second portion 220 to facilitate substrate staging and transfer therebetween. Here, the substrate holding stations 225a-b are each configured to hold a plurality of substrates and may be used for wet or dry substrate staging to increase flexibility in substrate handling operations and/or substrate processing sequences.

In some embodiments, the modular polishing system 200 further includes one or more first load-lock chambers 240A disposed between the SSC modules 236 and the substrate handler 224 and/or one or more second load-lock chambers 240B, disposed between the individual substrate handlers 226A,B and between a "wet" substrate processing area. Typically, each of the load-lock chambers 240A comprises a chamber body or chamber walls which define a load-lock volume having a holding station 225b disposed therein. Access to the load-lock volume from a substrate handling area 221 in which the substrate handler 224 resides, the SSC modules 236, and/or an area in which the substrate handler 226A resides is provided through openings disposed through the respective chamber walls therebetween and each of the openings is sealable with a door 241.

Typically, substrates are transferred into and out of the load-lock chambers 240A and 240B by individually opening and closing each of the doors 241 in a sequence that ensures that no more than one of the doors 241 to a load-lock volume is open at any one time. Thus, the load-lock chambers 240A-B may be used to fluidly isolate the atmospheres of individual modules and/or portions of the polishing system 200 from one another to prevent and/or substantially reduce the flow of contaminants therebetween. Thus, clean and dry substrates which have been processed in an SSC module 236 may be transferred from an SSC modules 236 to a load-lock chamber 240A and from the load-lock chambers 240A to the substrate handling area 221 without exposing the clean and dry substrate to the atmosphere of the "wet" substrate processing region 220B.

In some embodiments, clean dry air (CDA) or an inert gas (e.g., $N_2$) is provided to the load-lock volumes using a gas source 242 fluidly coupled thereto. In some embodiments, the atmosphere of the substrate handling area 221 is maintained at a higher pressure than the first portion 205, and the load-lock chambers 240A-B and SSC modules 236 are maintained at pressures therebetween. Maintaining a gradient of high to low pressure from the substrate handling area 221 to the first portion 205 through the chambers disposed therebetween ensure that the flow of air in the system moves from the substrate handling area 221 to the first portion 205 as the doors of various chambers and modules are opened and closed therebetween. The pressure gradient thus prevents undesirable contaminants from flowing from the first portion 205, the processing region 220B, and the SSC modules 236 into the load-lock chambers 240A-B and/or into the substrate handling area 221. In one example, the pressure drop between sequentially positioned process chambers, or processing regions, such as between the SSC modules 236 and the load-lock chambers 240A-B, or the substrate handling area 221 and the load-lock chambers 240A-B, is between about 0.1 and about 5 inches w.g.

In some embodiments, a load lock chamber may remain closed during a substrate transferring process until the relative humidity on one or more sides of a door 241 falls below the pre-defined reference relative humidity (RH) value. The RH may be lowered by initiating a flow of a suitable amount of an inert gas from the inert gas supply to a desired area on one side of the door 241. For example, it may be desirable to initiate a flow of a suitable amount of an inert gas into the load-lock chamber 240 (FIGS. 2C or 6B) before opening the door 241 separating the load-lock chamber 240 and the SSC module 236, 600b. Alternately, for example, it may be desirable to initiate a flow of a suitable amount of an inert gas into the SSC module 236, 600b, to lower the RH therein, and then assuring that a desirable pressure gradient is formed between the chambers before opening the door 241 separating the load-lock chamber 240 and the SSC module 236, 600b.

The arrangement of load-lock chamber 240A,B, substrate handlers 226A,B, and single substrate clean SSC modules 236, in FIG. 2C allows for defined substrate handling paths (shown as sequentially numbered arrows 1-17) which advantageously reduces exposure between wet and dry substrates and substrate handling surfaces to reduce cross-contamination events that might be otherwise associated therewith.

An individual HPC module 230 is shown in FIG. 2D and includes a chamber body 281 which defines a chamber volume 282, and a cleaning station 283, a pad carrier arm 284, and a pad conditioner station 285 collectively disposed in the chamber volume 282. The cleaning station 283 includes a vacuum chuck 291 which is used to support a substrate 180 in a horizontal orientation and to rotate the substrate 180 about an axis A and a fluid dispense arm 288 for distributing cleaning fluid to the surface of the substrate 180. The pad carrier arm 284 is pivotable about an axis B to sweep a cleaning pad 286 secured to a pad carrier 287 across the surface of the substrate 180 and to exert a downforce thereagainst. Here, the pad carrier arm 284 is configured to move the pad carrier 287, and thus the cleaning pad 286, between the substrate 180 and the pad conditioner station 285. The pad conditioner station 285 includes a pad conditioner 289, e.g., a brush or an abrasive disk, which is used to clean and rejuvenate the surface of the cleaning pad 286. The vacuum chuck 291 and the horizontal orientation of the substrate 180 secured thereon enables greater forces to be exerted on the substrate 180 by the cleaning pad 286 and thus greater cleaning efficiency of difficult to remove polishing fluid byproducts, e.g., polishing fluid residues, from the surfaces thereof. Here, cleaning fluids are collected using a drain 293 disposed through a base 290 of the chamber body 281 so that the HPC module 230 may be positioned in an upper part of the second portion 220 to advantageously allow for other modules or systems to be positioned thereneath.

FIGS. 3A-3B are schematic isometric views of respective single substrate clean (SSC) modules 300a,b, according to some embodiments, which may be used as a part of or in place of the SSC modules 236 shown in FIGS. 2A-2B.

Figure 6A:
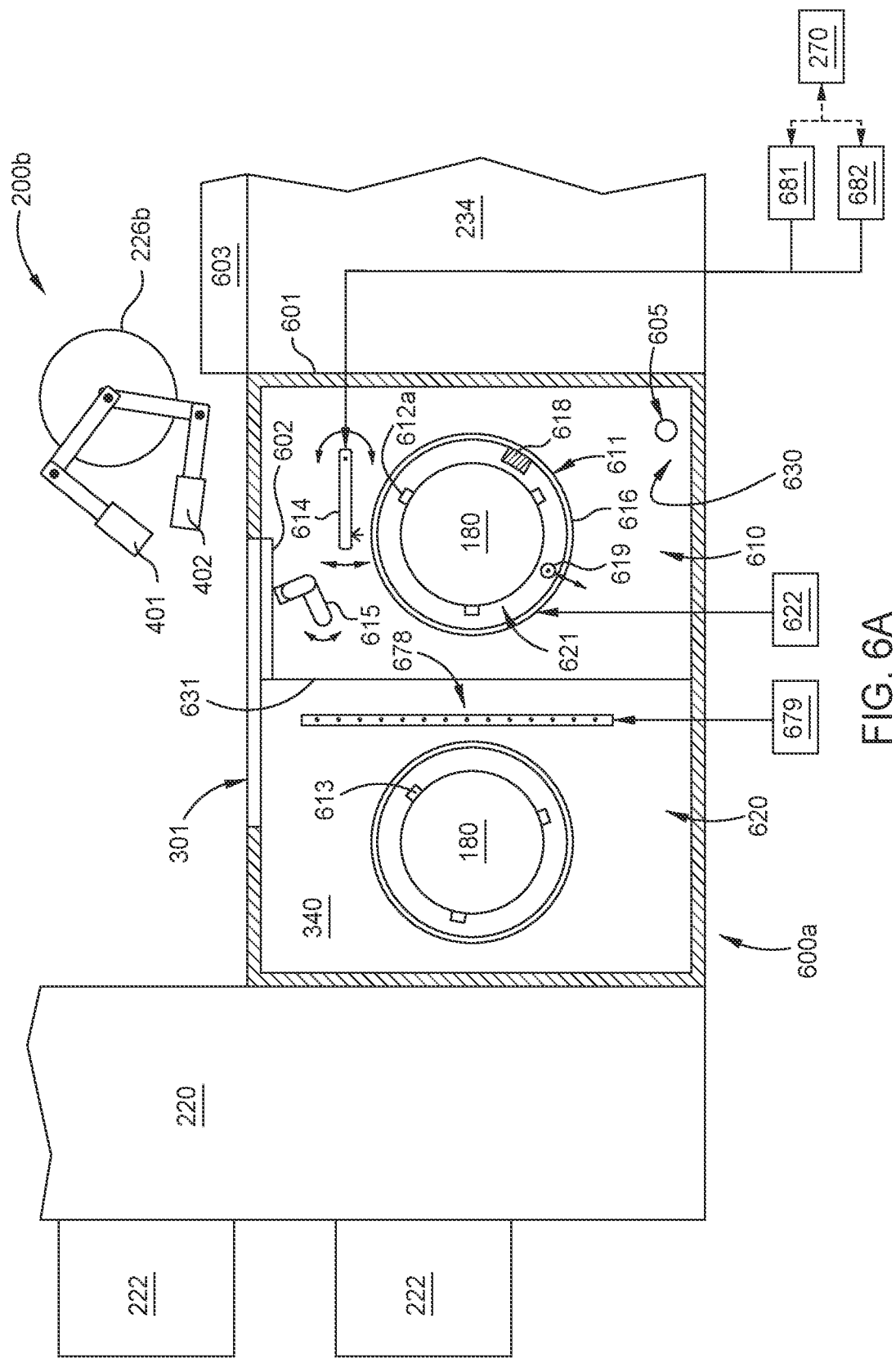
FIGS. 6A-6B are schematic top-down sectional views of alternate embodiments of a single substrate cleaning (SSC) modules, which may be used with the modular polishing system of FIGS. 2A-2B.
Figure 6B:
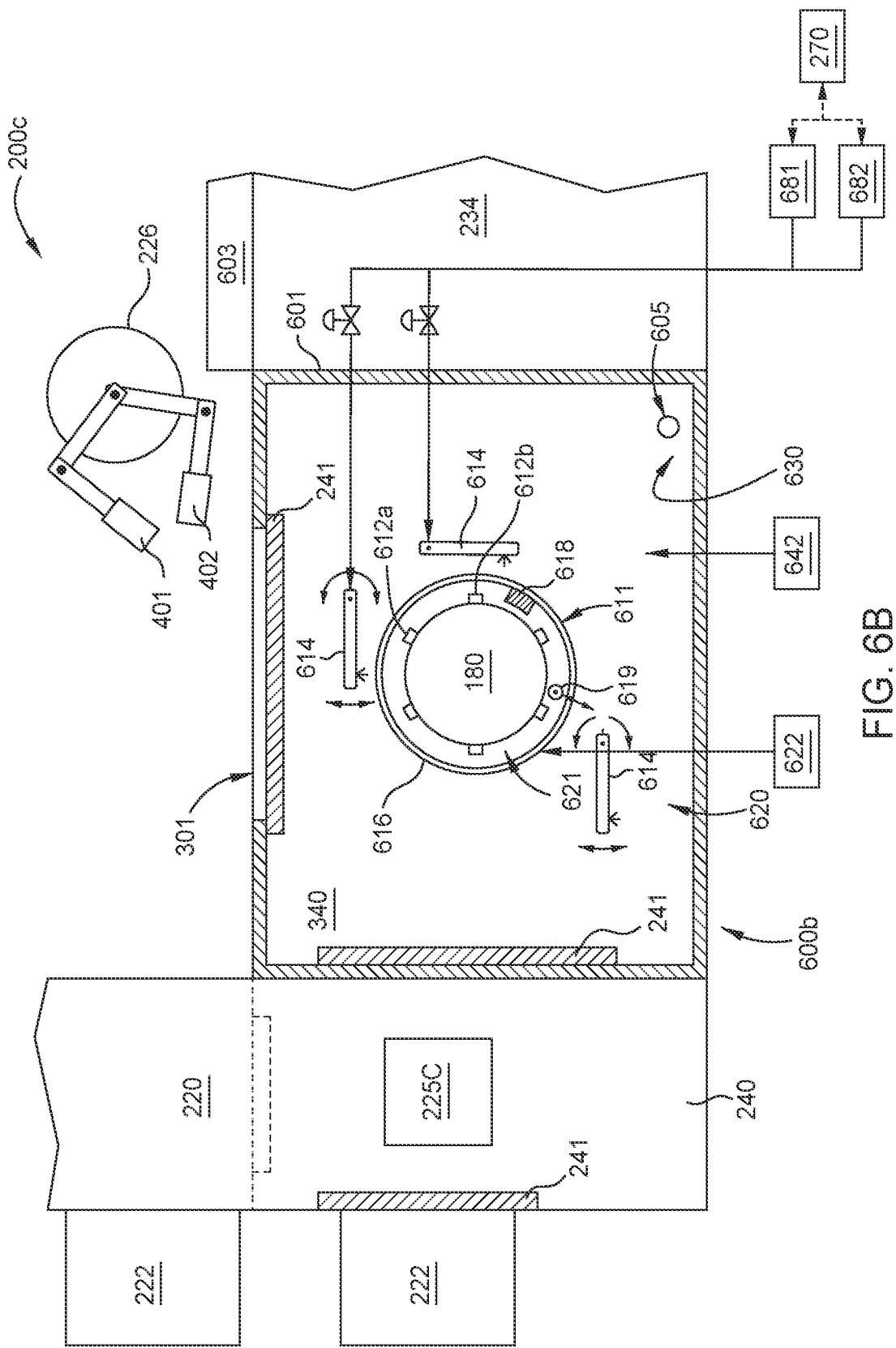

Here, each of the individual ones of the SSC modules 300a,b includes a chamber housing 303 which defines a chamber volume 340 and a cleaning station (not shown) disposed in the chamber volume 340, such as one of the cleaning stations shown in FIGS. 6A-6B. Generally, the SSC modules 300a,b are configured for both wet processing of the substrate to remove residual polishing contaminates therefrom, e.g., by using one or more cleaning fluids, and for drying the substrate thereafter. Thus, each of the SSC modules 300a,b provide an individual single substrate wet-in dry-out cleaning system.

Herein, each of the SSC modules 300a,b features one or more slot-shaped openings, e.g., a first opening 301 and an optional second opening 302, disposed through one or more sidewalls 310 of the chamber housing 303. The first and second openings 301, 302 provide substrate handler access to the chamber volume 340 and thus facilitate substrate transfer to and from the cleaning station. For example, in FIG. 3A, SSC module 300a includes a first opening 301 disposed though one of the sidewalls 310 and an optional second opening 302 disposed in the same sidewall 310 as the first opening 301. As shown in FIG. 3A, the second opening 302 is located in a portion of the sidewall 310 that is below (in the Y-direction) the first opening 301. In some embodiments, "wet" to-be-processed substrates are transferred into the chamber volume 340 through the second opening 302 and "dry" processed substrates are transferred out of the chamber volume 340 through the first opening 301. Alternatively, the first opening 301 and the second openings 302 may be respectively disposed through different sidewalls, such as shown in FIG. 3B, where the first opening 301 is disposed through a first sidewall 320 of the plurality of sidewalls 310, and the second opening 302 is disposed on a second sidewall 330 of the plurality of sidewalls 310. In embodiments where the first and second openings 301, 302 are disposed through different sidewalls, the first and second openings 301, 302 may be positioned at different or substantially the same positions in the Y-direction.

In FIG. 3B the first and second sidewalls 320, 330 are disposed on opposite sides of the SSC module 300b. In other embodiments, the first and second openings 301, 302 may be disposed through respective sidewalls that are orthogonal to one another. Beneficially, the placement of the first opening 301 and the second opening 302 in different sidewalls 320, 330 and/or in the same sidewall 310 (FIG. 3A) and dedication of each opening for the transfer of wet or dry substrates desirably minimizes cross-contamination between wet substrates that enter the SSC module 236 and dry substrates that exit the SSC module 236. The first and second openings 301, 302 may be positioned at substantially the same or different vertical heights relative to a floor, i.e., in the Y-direction.

Figure 4A:
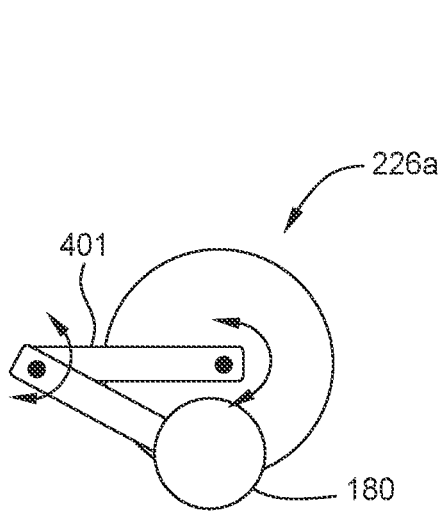
FIG. 4A is a schematic top view of one of the substrate handlers shown in FIGS. 2A-2B.
Figure 4B:
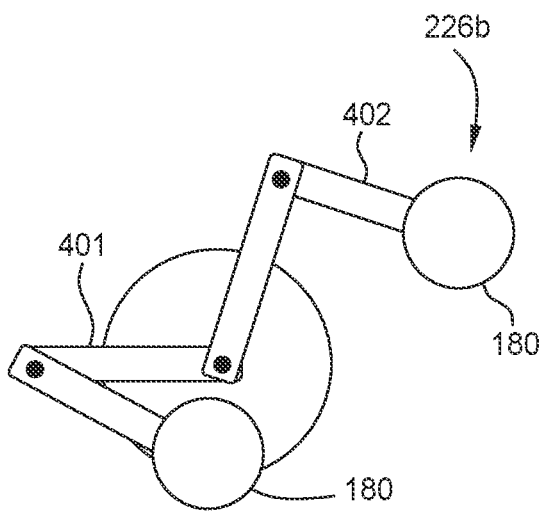
FIG. 4B is a top view of a substrate handler, according to another embodiment, which may be used with the modular system polishing system of FIGS. 2A-2B.

FIGS. 4A and 4B are schematic top views of substrate handlers 226a and 226b which may be used as the one or more substrate handlers 226 shown in FIGS. 2A-2C. The substrate handlers 226a,b are configured to move substrates in the X, Y and Z directions, and, in some embodiments, to change the orientation of a substrate from a vertical orientation to a horizontal orientation or vice versa to facilitate substrate transfer between the various modules and systems of the modular polishing system 200. Here, the substrate handlers 226a,b include one or more arms 401 each having an end effector 403 (shown in phantom) coupled thereto. In FIG. 4A, the substrate handler 226a features a single end effector 403 which may be used to both transfer wet substrates into an SSC module 300a,b and to remove dry substrates therefrom.

In FIG. 4B, the substrate handler 226b features first and second arms 401a,b and corresponding first and second end effectors 403a,b (shown in phantom) coupled thereto. Here, a first end effector 403a is dedicated to handling wet substrates, i.e., substrates to be transferred to the SSC modules 300a,b and the second end effector 403b is dedicated to handling dry substrates, i.e., substrates to be transferred from the SCC modules 300a,b. The use of dedicated end effectors 403a,b for transferring substrates to and from the SSC modules 300a,b desirably reduces undesirable transfer of contaminants received from surfaces of a wet substrate transferred into an SSC module 300a,b to surfaces of a dry substrate that is transferred out of the SSC module 300a,b. In some embodiments, the first end effector 403a is used to transfer substrates into the SSC module 300a,b through the first opening 301 and the second end effector 403b is used to transfer substrates out of the SSC module 300a,b through the second opening 302.

Figure 5A:
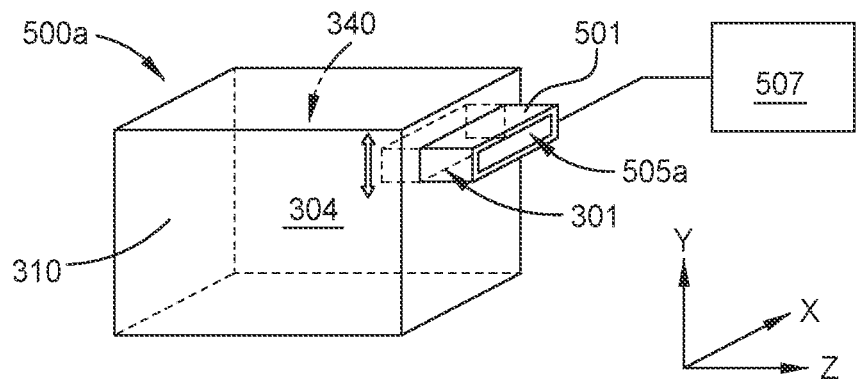
FIGS. 5A-B are schematic perspective views of alternate embodiments of the wet clean chamber shown in FIG. 3A.
Figure 5B:
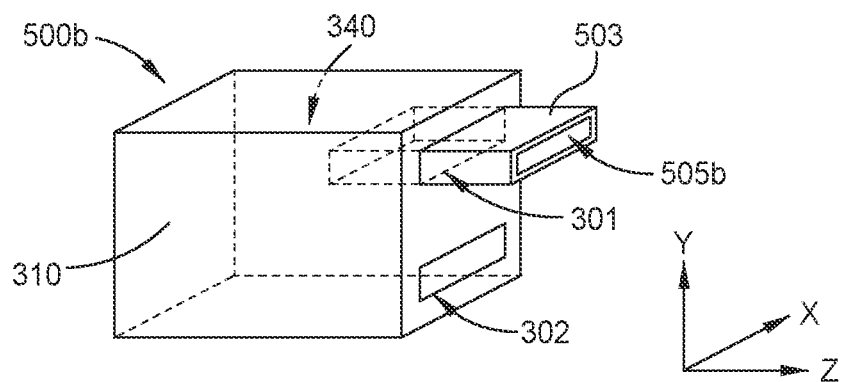

FIGS. 5A-5B are schematic perspective views of alternate embodiments of respective single substrate clean (SSC) modules 500a-b, each of which be used as a portion of or in place of the SSC modules 236 shown in FIGS. 2A-2C. Here, the SSC module 500a includes a chamber housing 303 defining a chamber volume 340. The chamber housing 303 includes a plurality of sidewalls 310, where a first opening 301 is formed in one of the sidewalls 310, and a tunnel 501 is disposed in alignment with the first opening 301 and extending outwardly from the sidewall 310 to define a substrate transfer tunnel 505a. In some embodiments, the tunnel 501 is coupled to an actuator 507 which is configure to move the tunnel away from the first opening 301, e.g., by moving the tunnel up or down (in the Y-direction) relative to the sidewall 310. In those embodiments, the tunnel 501 may be moved away from the first opening 301 when dry substrates are transferred out of the chamber volume 340 and moved back to be in alignment with the first opening 301 when wet substrates are transferred into the chamber volume 340. Thus, in those embodiments the tunnel 501 may be used to prevent wet substrates from transferring contaminants to surfaces of the opening 301 and/or sidewalls 310 of the SSC module 500a as the substrate is loaded thereinto.

In some embodiments, such as shown in FIG. 5B, a tunnel 503 is fixedly coupled to the SSC module 500b, such as fixedly coupled to a sidewall 310 of the SSC module 500b, and is disposed in alignment with the first opening 301 to define a substrate transfer tunnel 505b therewith. In those embodiments, the tunnel may extend outwardly from the sidewall 310, extend inwardly from the sidewall 310 to be at least partially disposed in the chamber volume 340, or both (as shown). In other embodiments, the tunnel 503 is disposed in alignment with the second opening 302. In some embodiments, the SSC module 500b includes a plurality of tunnels 503 each disposed in alignment with a respective opening 301, 302 to define a corresponding substrate transfer tunnel 505b therewith. Typically, in each of these embodiments one of the openings 301, 302 is used for transferring wet substrates into the chamber volume 340 and the other one of the two opening 301, 302 is used for transferring dry substrates out of the chamber volume 340, thus minimizing reintroduction of contaminants and/or fluids to the surfaces of the dry substrate.

In some embodiments, the first opening 301 and/or the second opening 302 include a door (not shown) and door actuator (not shown) which may be used to seal the first opening 301 and/or the second opening 302 when in a closed positioned to allow substrates to be transferred in or out of the first opening 301 and/or the second opening 302 when in an open position. When the door is in a closed position, the interior of the SSC module 500b, e.g., the chamber volume 340, is desirably isolated from the environment of the second portion 220 to limit contaminants from the second portion from flowing thereinto.

FIG. 6A is a schematic top-down sectional view of a portion of an SSC module 600a, according to another embodiment, which may be used as part of or in place of the SSC module 236 shown in FIGS. 2A-2B. Here, the SSC module 600a is shown as integrated with a portion of the modular polishing system 200b, which is substantially similar to the modular polishing system 200 of FIGS. 2A-2B. In one embodiment, which can be combined with other embodiments disclosed herein, such as having any combination of the features shown in the FIGS. 3A-3B and 5A-5B, the SSC module 600a features two separate sections: a wet region 610 and a dry region 620 and the modular polishing system 200b uses the second substrate handler 226b described in FIG. 4B for substrate transfer thereto and therefrom. As described above, the second substrate handler 226b, has two substrate handler arms 401, 402 each of which may be dedicated for wet or dry substrate handling in order to reduce cross-contamination between the wet region 610 and the dry region 620.

In some embodiments, an end effector cleaning and/or drying system 603 is disposed adjacent to the second substrate handler 226b. The end effector cleaning and/or drying system 603 enables the same substrate hander arm 401 to be used for transporting both wet and dry substrates 180 by cleaning and/or drying the substrate handler arm 401 between substrates transfer operations. Typically, the end effector cleaning and/or drying system 603 includes one or more spray nozzles coupled to a fluid source. During a cleaning operation the cleaning and/or drying system 603 directs a stream of a cleaning fluid (e.g., deionized (DI) water) to one or more portions of the substrate handler arm(s) or end effector(s) to remove any undesirable contamination. During a drying operation the cleaning and/or drying system 603 may direct a gas (e.g., $N_2$, CDA) and/or other types of fluids (e.g., alcohol containing vapor) across one or more portion of the substrate handler arm(s) or end effector(s) to promote drying of these components.

Several components may be included on the wet region 610 in order to clean and also prevent the substrates 180 from drying prematurely, which may result in debris or other undesirable particles remaining on the substrates 180. For example, the wet region 610 may include a set of wet lift pins 612a, which are a part of a substrate support 621 and are disposed within a wet processing module 611. The wet processing module 611 includes a wet processing cup 616 that is configured to collect any fluids applied to a surface of a substrate during a wet-cleaning process performed in the wet region 610 of the SSC module 600a. The wet processing cup 616 can be connected to an exhaust system (not shown) and drain (not shown).

The wet region 610 includes one or more spray bars 614 (three shown), such as two more spray bars 614, or three or more spray bars 614. Each of the spray bars 614 includes a plurality of nozzles which direct a fluid (e.g., DI water) onto the substrate 180 when the spray bar is positioned thereover. Here, each of the one or more spray bars 614 includes a plurality of nozzles. In some embodiments, a first fluid source 681 and a second fluid source 682 are fluidly coupled to individual ones of a plurality of spray bars 614. In one embodiment, the first fluid source 681 provides DI water to the spray bars 614. In one embodiment, the second fluid source 682 provides one or more cleaning fluids (e.g., acid, base, solvent, drying agents (e.g., alcohol), etc.) to the spray bars 614. The system controller 270 controls to the first fluid source 681 and/or the second fluid source 682. In one embodiment, a wet substrate placement sensor (not shown) is disposed in the wet region 610 to detect whether substrates 180 transported into the wet region 610 are sufficiently wet. If the substrates 180 are determined to be insufficiently wet before or during wet processing within the wet region 610, the spray bar may be activated to deliver a fluid to a surface of the substrate. Upon completion of a wet cleaning process performed in the wet region 610 of the SSC module 600a, a drying agent and/or gas may be applied to the substrate before it is transferred to the dry region 620.

Additionally, the SSC module 600a may include a separate third substrate handler 615 configured to transfer the substrate 180 between the wet region 610 and the dry region 620. This third substrate handler 615 allows the wet region 610 and the dry region 620 to be separate within the SSC module 600a. The SSC module 600a may include a substrate handler cleaning and/or drying system (not shown) disposed therein. The substrate handler cleaning and/or drying system may be similar to the system described above used with the end effector cleaning and/or drying system 603.

Residue and other unwanted particles may remain on the outer edge of the substrate 180; thus, an apparatus for cleaning the outer edge of the substrate 180 is desired. For example, a wheel 619 may be moved and selectively positioned by an actuator (not shown) to clean the edge of the substrate 180 during different times of a substrate cleaning process performed in the SSC module 600a. Alternatively, or in combination with the wheel 619, a spray nozzle 618 may be positioned to clean the edge of the substrate 180 by spraying a cleaning fluid (e.g., DI water) along the edge of the substrate 180. The substrate 180 rotates on the substrate support 621 so that the spray nozzle 618 or the wheel 619 cleans the entire outer edge of the substrate 180. A motor 622 powers the rotation of the substrate support 621.

In order to prevent accumulation of fluid on the exposed surfaces of the wet region 610 of the SSC module 600a, the exposed internal surfaces 630 may be angled or slanted in order to direct fluid towards a drain 605. The drain is positioned at a relatively low portion of the SSC module 600a. In one embodiment, which can be combined with other embodiments disclosed herein, the SSC module 600a includes seals (not shown) to prevent fluid form escaping the wet region 610 and impinging upon the dry region 620 and/or other portions of the chamber.

The dry region 620 of the SSC module 600a includes a set of dry lift pins 613 configured to support the substrate 180 as it is dried. The dry region 620 further includes an ionizer bar 678 disposed adjacent to the substrate support 621 on the dry region 620. The ionizer bar 678 is able to direct a flow of air to create an air curtain that impinges upon the substrate 180 as it is passed from the wet region 610 to the dry region 620. The power supply 679 is used to ionize the gas flowing from the ionizer bar 678 as it flows out of the ionizer bar 678. The resulting ionized gas is used to remove any residual charge formed on the substrate 180 during processing.

In some embodiments, a physical divider 631 is disposed between the wet region 610 and the dry region 620. The physical divider 631 can include a slot shaped opening that is sized to allow the transfer of the substrate between the wet region 610 and the dry region 620 by the third substrate handler 615.

In order to further mitigate unwanted airflow, the SSC module 600a may include an airflow management system (not shown). In one embodiment, which can be combined with other embodiments disclosed herein, the airflow management system includes a HEPA filter, which is positioned over at least a portion of the processing region of the SSC module 600a, and a local exhaust system. In one embodiment, the airflow management system is an apparatus for maintaining positive pressure within the SSC module 600a during at least the transfer of the one or more substrates 180 in or out of the SSC module 600a. In one embodiment, the airflow management system includes one or more load-locks coupled to the openings of the SSC module 600a.

In other embodiments, such as illustrated in FIG. 6B, an SSC module 600b may feature a single processing station within the chamber volume 340 which is configured for sequential wet processing and drying of the substrate thereafter. In FIG. 6B the SSC module 600b is integrated with a modular polishing system which is substantially similar to the modular polishing system 200 of FIGS. 2A-2B or 200b of FIG. 6A. Here, the SSC module 600b may have include any one or combination of the features described in FIGS. 3A-3B, 5A-5B, and 6A. Here, the SSC module 600b is configured for both wet processing, e.g., cleaning using on or more fluids, and drying in the region of the chamber volume 340 using the same substrate support 621. Here substrates are transferred to the substrates support using a first set of lift pins, here the wet lift pins 612a. Once the substrate is cleaned and dried a second set of lift pins, here the dry lift pins 612b are used to lift the substrate from the substrate support 621 to facilitate access thereto by a substrate handler arm. Thus, the wet lift pins 612a, which may have residual fluids thereon, do not make contact with a dry substrate and reintroduction of residual fluids to the substrate surfaces from the wet lift pins 612a can be desirably avoided.

Figure 6C:
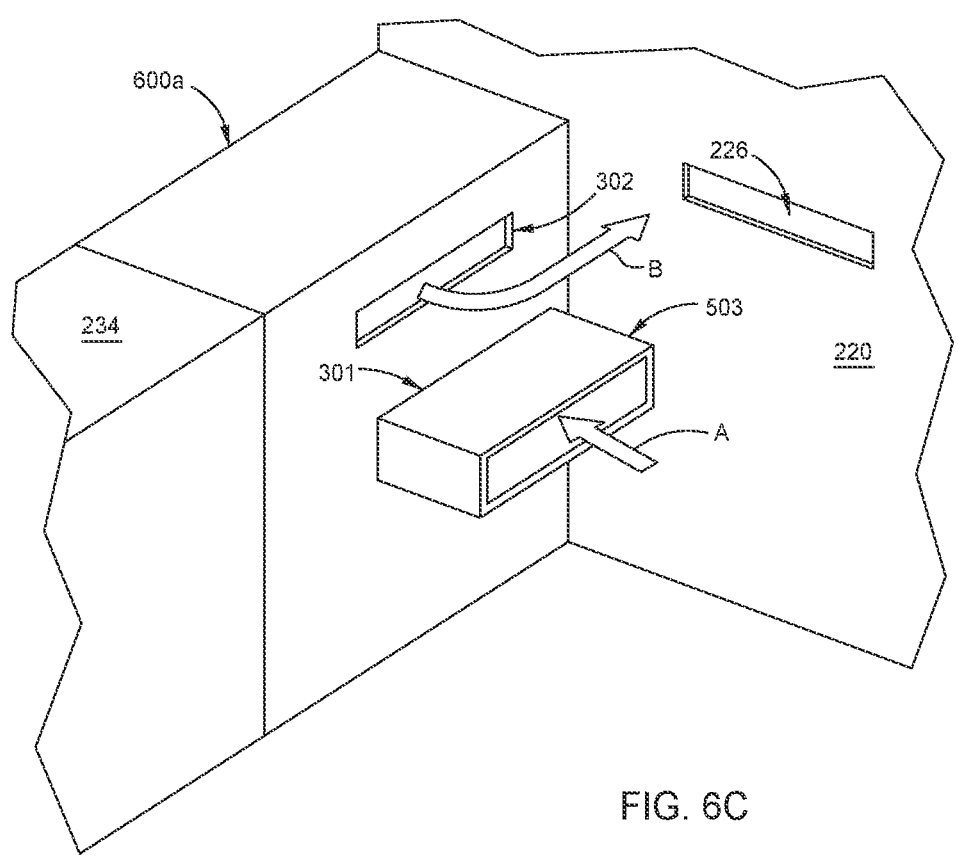
FIG. 6C is a schematic perspective view of an exterior portion of the chamber of FIG. 6A according to one embodiment.

FIG. 6C is a schematic perspective view of an exterior portion of the SSC module 600a of FIG. 6A according to one embodiment. In one embodiment, which can be combined with other embodiments disclosed herein, a tunnel 501 is aligned with the first opening 301 to define a substrate transfer tunnel 505c in registration therewith. The tunnel 505c desirably prevents fluids and/or other contaminates disposed on surfaces of the wet substrates 180 which enter the SSC module 600c through the first opening 301 from dripping on or migrating to surfaces of dry substrates 180 exiting the SSC module 600a from the second opening 302. The wet substrates 180 enter the tunnel 505c at the entrance 660 in the A direction, and the dry substrates exit the second opening 302 in the B direction before being transported to other processing regions of the modular polishing system 200b, for example one of the plurality of system loading stations 222.

Here, each of the tunnels 505a-c has a width which is greater than the diameter of a to-be-processed substrate, e.g., greater than 320 mm, greater than about greater than about 350 mm, or between about 300 mm and about 400 mm. The tunnels 505a-c have a height sufficient to accommodate the thickness of the substrate and an end effector of the substrate handler, such as about 2.5 cm or more, about 5 cm or more, about 7.5 cm or more, or about 10 cm or more, or between about 2.5 cm and about 20 cm, such as between about 2.5 cm and about 15 cm, or between about 2.5 cm and about 10 cm. In some embodiments, such as where the tunnels extend outwardly from the sidewalls 310, or extend inwardly into the chamber volume 340, a length of the tunnels may be more than about 100 mm, such as more than about 150 mm, more than about 200 mm, more than about 250 mm, or more than about 300 mm, or between about 100 mm and about 1000 mm, such as between about 100 mm and about 750 mm or between about 100 mm an about 500 mm. In some embodiments an aspect ratio (length to height, where height is measured in the Y direction) is more than 5:1, such as more than about 10:1. The tunnel sizes above may be used for an SSC module sized to process a 300 mm substrate. Appropriate scaling may be used for SSC modules sized to process substrates having different diameters.

Beneficially, the wet cleaning systems and related substrate handling and transfer schemes described above substantially reduce and/or elements unwanted reintroduction of fluids and/or other contaminants to a dry substrate surface following a wet-in dry-out cleaning process in a single wafer wet cleaning chamber. By preventing reintroduction of contaminants onto the surfaces substrates following a post-CMP cleaning process increased defectivity and the suppressed yield of usable devices and/or device performance and reliability problems associated therewith can be desirably avoided.

While the foregoing is directed to embodiments of the present disclosure, other and further embodiments of the disclosure may be devised without departing from the basic scope thereof, and the scope thereof is determined by the claims that follow.

What is claimed is:

1. A substrate cleaning system, comprising:
    a chamber housing defining a chamber volume, a first sidewall of the chamber housing having a first opening formed therethrough for receiving a substrate into the chamber volume;
    a substrate support disposed in the chamber volume;
    a first door or first valve which is operable to cover or seal the first opening;
    a first lift pin assembly comprising a plurality of first pins for receiving a substrate from a substrate handler and positioning the substrate on the substrate support;
    a second opening formed through the chamber housing;
    a second lift pin assembly comprising a plurality of second pins positioned to lift the substrate from the substrate support to allow access to the substrate by the substrate handler, wherein the plurality of second pins are different from the plurality of first pins; and
    the substrate handler positioned to transfer substrates into the chamber volume, wherein the substrate handler comprises:
        a first end effector coupled to a first arm; and
        a second end effector coupled to a second arm,
    wherein the first end effector is used to transfer wet substrates into the chamber volume through the first opening and the second end effector is used to transfer dry substrates out from the chamber volume through the second opening.

2. The substrate cleaning system of claim 1, further comprising:
    a tunnel extending outwardly from the chamber housing, wherein the tunnel is disposed in alignment with the first opening to allow for substrate transfer therethrough; and
    a load-lock chamber adjacent to the chamber housing, wherein an opening in the load-lock chamber is aligned with the second opening of the chamber housing.

3. The substrate cleaning system of claim 1, further comprising one or more first nozzles positioned to direct a drying fluid at the plurality of first lift pins.

4. The substrate cleaning system of claim 1, further comprising a tunnel disposed in alignment with the first opening to define a substrate transfer path therewith.

5. The substrate cleaning system of claim 1, wherein a second sidewall of the chamber housing has the second opening formed therethrough, and a door or valve is operable to cover or seal the second opening.

6. The substrate cleaning system of claim 5, further comprising a load-lock chamber adjacent to the substrate cleaning system, wherein an opening in the load-lock chamber is aligned with the second opening.

7. The substrate cleaning system of claim 6, wherein the second sidewall is adjacent to the first sidewall.

8. The substrate cleaning system of claim 4, wherein the second opening is disposed through the first sidewall above the first opening.

9. The substrate cleaning system of claim 4, wherein the tunnel extends into the chamber volume.

10. The substrate cleaning system of claim 8, further comprising a second tunnel extending outwardly from the chamber housing, wherein the second tunnel is disposed in alignment with the second opening to allow for substrate transfer therethrough.

11. The substrate cleaning system of claim 3, further comprising one or more second nozzles disposed proximate to the substrate support and positioned to direct a fluid towards a peripheral edge of a substrate disposed thereon.

12. The substrate cleaning system of claim 2, wherein the first sidewall of the chamber housing is adjacent to a second sidewall of the chamber housing, wherein the first sidewall or the second sidewall of the chamber housing has the second opening formed therethrough, and a second door or second valve is operable to cover or seal the second opening.

13. The substrate cleaning system of claim 12, wherein the second opening is disposed through the second sidewall.

14. The substrate cleaning system of claim 12, wherein the second opening is disposed through the first sidewall above the first opening.

15. The substrate cleaning system of claim 14, further comprising a second tunnel extending outwardly from the chamber housing, wherein the second tunnel is disposed in alignment with the first opening or the second opening to allow for substrate transfer therethrough.

* * * * *